(12) United States Patent
Sun et al.

(10) Patent No.: US 12,108,579 B2
(45) Date of Patent: Oct. 1, 2024

(54) CONTAINER TYPE FREQUENCY CONVERSION PRY

(71) Applicant: QINGDAO CCS ELECTRIC CORPORATION, Qingdao (CN)

(72) Inventors: Xianzhou Sun, Qingdao (CN); Yimin Shen, Qingdao (CN); Chenglin Song, Qingdao (CN)

(73) Assignee: QINGDAO CCS ELECTRIC CORPORATION, Qingdao (CN)

( * ) Notice: Subject to any disclaimer, the term of this patent is extended or adjusted under 35 U.S.C. 154(b) by 164 days.

(21) Appl. No.: 17/781,015

(22) PCT Filed: Nov. 16, 2020

(86) PCT No.: PCT/CN2020/128971
§ 371 (c)(1),
(2) Date: May 30, 2022

(87) PCT Pub. No.: WO2021/104073
PCT Pub. Date: Jun. 3, 2021

(65) Prior Publication Data
US 2023/0008191 A1 Jan. 12, 2023

(30) Foreign Application Priority Data
Nov. 29, 2019 (CN) .......................... 201911202821.2

(51) Int. Cl.
*H05K 7/20* (2006.01)
*H01F 27/02* (2006.01)
*H05K 7/14* (2006.01)

(52) U.S. Cl.
CPC ....... *H05K 7/20909* (2013.01); *H01F 27/025* (2013.01); *H05K 7/1432* (2013.01); *H05K 7/20927* (2013.01)

(58) Field of Classification Search
CPC .................................................. H01F 27/025
See application file for complete search history.

(56) References Cited

U.S. PATENT DOCUMENTS

2012/0077427 A1* 3/2012 Wei .................... H05K 7/20745
454/184

FOREIGN PATENT DOCUMENTS

| CN | 201590751 | 9/2010 |
|----|-----------|--------|
| CN | 102075066 | 5/2011 |

(Continued)

OTHER PUBLICATIONS

English translation of CN 102075066 A (Year: 2011).*

*Primary Examiner* — Mukundbhai G Patel
(74) *Attorney, Agent, or Firm* — Jiwen Chen; Joywin IP Law PLLC

(57) ABSTRACT

A container type variable-frequency drive skid includes a container body, wherein a containing space is provided in the container body, a wiring unit, a voltage transformation unit and a frequency conversion unit are arranged in the containing space, a first cooling unit and a second cooling unit are further arranged in the containing space, the first cooling unit comprises an air duct and a first heat dissipation fan arranged in the air duct, the voltage transformation unit is located in the air duct, air flows through the air duct under the action of the first heat dissipation fan to cool the voltage transformation unit, the second cooling unit comprises a cold guide assembly and a second heat dissipation fan, and the cold guide assembly abuts against the frequency conversion unit. The first cooling unit cools the voltage transformation unit in an air-cooling manner, and the second cooling unit cools the frequency conversion unit in an air cooling and water-cooling combined manner, such that the situation that the voltage transformation unit and the frequency conversion unit cannot operate normally due to too (Continued)

high a temperature is avoided, and the operation efficiency and reliability of the whole machine are improved.

9 Claims, 6 Drawing Sheets

(56) References Cited

FOREIGN PATENT DOCUMENTS

| CN | 102075066 A | * | 5/2011 | ............ | H02M 1/00 |
|---|---|---|---|---|---|
| CN | 203166742 | | 8/2013 | | |
| CN | 203942436 | | 11/2014 | | |
| CN | 206585455 | | 10/2017 | | |
| CN | 208316557 | | 1/2019 | | |
| GB | 2587618 | * | 9/2019 | ............ | H05K 7/20 |

* cited by examiner

CONTAINER TYPE FREQUENCY CONVERSION PRY

This is a U.S. national stage application of PCT Application No. PCT/CN2020/128971 under 35 U.S.C. 371, filed Nov. 16, 2020 in Chinese, claiming priority to Chinese Patent Applications No. 201911202821.2 filed Nov. 29, 2019, all of which are hereby incorporated by reference.

TECHNICAL FIELD

The present invention relates to the technical field of drilling and extraction equipment for petroleum, coal bed methane or shale gas, in particular to a container type variable-frequency drive skid.

BACKGROUND TECHNOLOGY

The electric-driven fracturing pumps just started to develop at current stage. A typical fracturing pump is powered by a motor driven by a variable-frequency drive (VFD, also known as inverter). But served as the power supply of the fracturing pump motor, the VFD currently faces a primary problem that the ordinary VFD could not be applied in oilfield workplaces directly; while some inverters provided with protective enclosures have disadvantages of being large in dimension, heavy in weight and low in power density. Additionally, one VFD could drive only one fracturing pump.

To solve those problems, container type variable-frequency drive skid has emerged, which is a construction block could be built by integrating power transformers, inverter units, wiring units and other components to reduce its overall size, as well as improve overall power. By means of further designs on the power transformers and inverter units, multiple independent inverter circuits could be output at the same time to provide power for a plurality of independent fracturing pump motors and also fulfill speed regulation, further to boost work efficiency.

The above-mentioned information disclosed in the background art is only used to increase the understanding, and therefore, it may include the prior art that is not known to those of ordinary skill in the art.

SUMMARY OF THE INVENTION

Technical problem

Integrated one-piece structure and high power output are bound to increase heat generated. If internal electrical components could not be cooled in time, normal operation is likely to be affected, and further reduce operating efficiency and reliability of the whole machine.

Technical Solutions

In view of this, the present invention proposes a variable-frequency drive skid, which uses a first cooling unit to dissipate heat and reduce temperature of power transformer unit, and uses a second cooling unit to dissipate heat and reduce temperature of inverter unit, so as to prevent failure of the power transformer unit and the inverter unit caused by exceeding their thermal limits, thereby improving operating efficiency and reliability of the overall device.

In order to achieve the above-mentioned purpose of the present invention, the following technical solutions are adopted.

A container type variable-frequency drive skid including a container body with an accommodation space formed therein, the power transformation unit is provided with a wiring unit, a power transformation unit and an inverter unit, wherein the skid further includes: a first cooling unit arranged in the accommodation space, which includes: an air duct in which the power transformation unit is disposed; and a first cooling fan arranged in the air duct, which is configured to drive air pass the air duct for cooling of the power transformation unit; and a second cooling unit arranged in the accommodation space including a cooling conductive assembly disposed close to the inverter unit and a second cooling fan which are configured to cool down the inverter unit.

Further, the air duct includes: a vertical air duct, within which the power transformation unit is disposed; a horizontal air duct disposed above the vertical air duct and communicated with the vertical air duct, within which the first cooling fan is arranged; the first cooling unit further includes: an air inlet and an air outlet which are communicated with the air duct; wherein the air inlet is in communication with the vertical air duct and the air outlet is in communication with the horizontal air duct.

Further, the air inlet is disposed at a lower position on a rear side of the container body and the air outlet is disposed at an upper position on a front side of the container body.

Further, the air inlet and the air outlet are provided with rain-proof shutters.

Further, in the cooling conductive assembly refrigerant circulates; the cooling conductive assembly includes: a refrigerant containment box arranged on the second cooling fan; and a cooling conductive plate assembly disposed close to the inverter unit, which is fluid communicated with the refrigerant containment box through a first pipe.

Further, a discharge port is formed on the first pipe.

Further, the cooling conductive plate assembly includes a plurality of cooling conductive plate sub units arranged side by side, each cooling conductive plate sub unit includes a plurality of cooling conductive plates arranged side by side and two adjacent cooling conductive plates within one cooling conductive plate sub unit are in communication with each other through a second pipe.

Further, the cooling conductive plates are detachably connected to the inverter unit.

Further, the refrigerant containment box and the second cooling fan are located at an end side of the accommodation space and the cooling conductive plate assembly is located at a rear area of the accommodation space.

Further, the container body is close to the second cooling fan and heat dissipation protective meshes are provided at positions of the container body close to the second cooling fan, the refrigerant containment box and the cooling conductive plate assembly respectively.

Beneficial Effect

Compared with the prior art, the advantages and positive effects of the present invention are:

the first cooling unit removes excess heat from the power transformation unit by means of air while the second cooling unit removes excess heat from the inverter unit by means of a combination of air and refrigerant, so as to make full use of internal space of the container and also to timely cool the power transformation unit and the inverter unit based on the integrated structure, thereby avoiding the voltage power transformation unit and the inverter unit from being unable to operate normally due to excessive high temperature, and therefore the operating efficiency and reliability of the whole machine is improved.

BRIEF DESCRIPTION OF THE DRAWINGS

In order to provide a clearer explanation of the present invention or technical solution in the prior art, a brief introduction of the drawings that are used is followed. It should be noted that obviously those drawings correspond to merely some embodiments of the present invention. For those of ordinary skill in the art, other drawings could be obtained without creative work.

Figure 1:
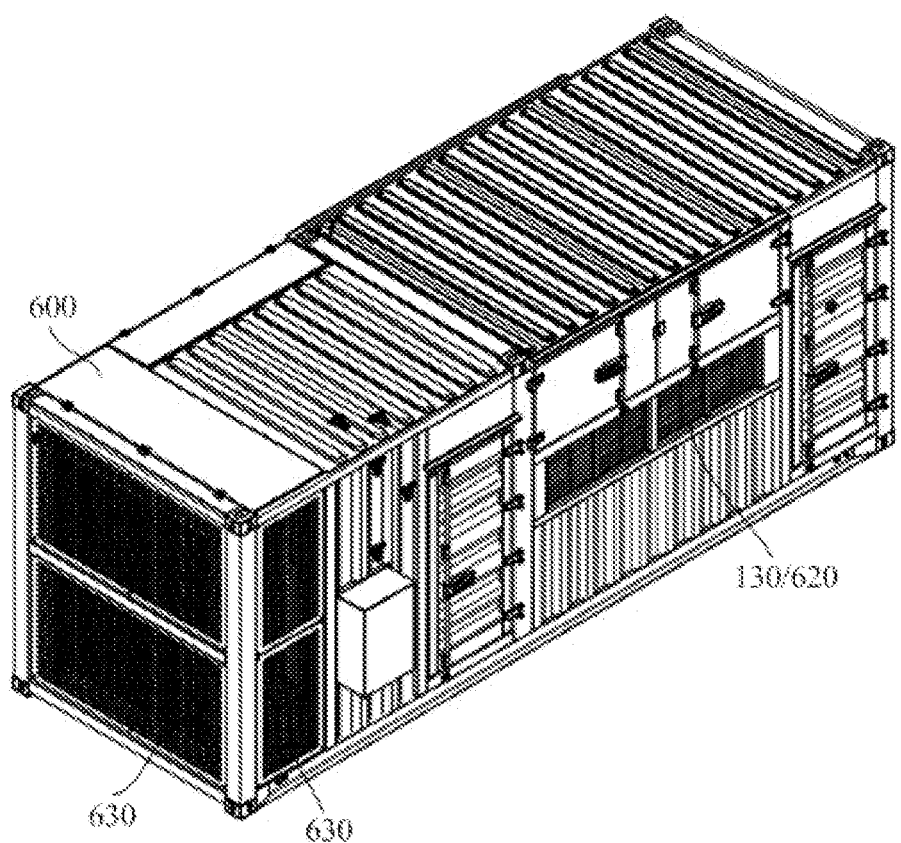
FIG. 1 is a front view structural schematic diagram of a container type variable-frequency drive skid according to the present invention.

Wherein,
100—first cooling unit, 110—air duct, 111—vertical air duct, 112—horizontal air duct, 120—air inlet, 130—air outlet, 140—first cooling fan, 150—connecting plate, 160—lifting ring;
200—second cooling unit, 210—cooling conductive assembly, 211—refrigerant containment box, 212—cooling conductive plate assembly, 2121—cooling conductive plate, 2122—cooling conductive plate sub unit, 213—first pipe, 2131—inlet pipe, 2132—outlet pipe, 2131—discharge port, 214—second pipe, 220—second cooling fan, 230—hinge;
300—wiring unit;
400—power transformation unit, 410—bracket;
500—inverter unit, 510—mounting plate;
600—container body, 610—accommodation space, 620—rain-proof shutters, 630—heat dissipation protective mesh.

DETAILED DESCRIPTION OF THE EMBODIMENTS OF THE INVENTION

To make objectives, technical solutions and advantages clearer, embodiments of the present invention will be described in conjunction with the accompanying drawings. Obviously, the described embodiments are merely a part based on the present invention and other embodiments obtained by those of ordinary skill in the art without creative work shall fall within the protection scope of the present invention.

It should be noted that in the description of the present invention, terms 'upper', 'lower', 'left', 'right', 'vertical', 'horizontal', 'inner', 'outer' and the like only indicate directions or positional relationship shown in the drawings, which is only for a clear description and does not indicate or imply that devices or elements must have, or be constructed, or be operated in, a specific orientation, and therefore could not be understood as limitations of the present invention. In addition, the terms 'first' and 'second' are only used for descriptive purposes, and could not be understood as indication or implication of relative importance.

Figure 2:
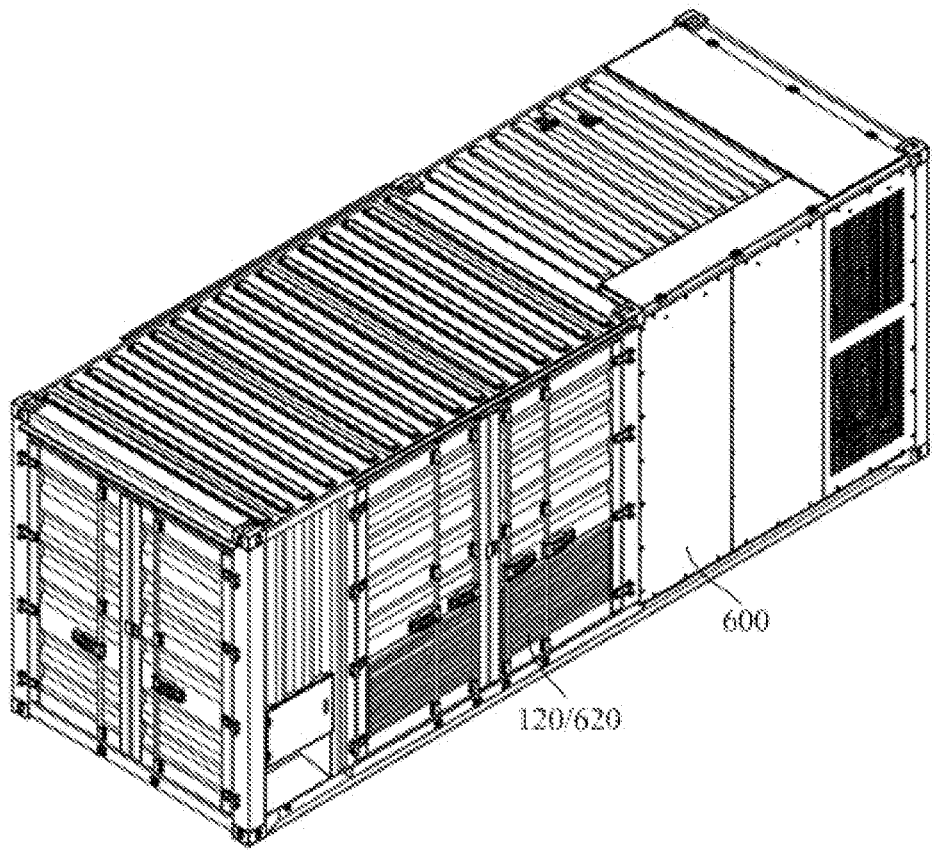
FIG. 2 is a rear view structural schematic diagram of a container type variable-frequency drive skid according to the present invention.
Figure 3:
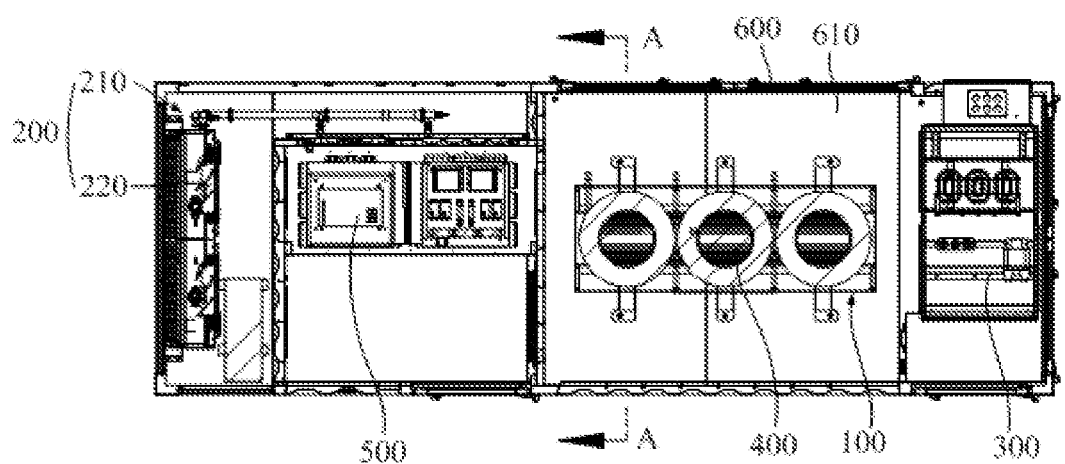
FIG. 3 is a top view of a container type variable-frequency drive skid according to the present invention, in which an upper cover is omitted.

The present invention discloses a container type variable-frequency drive skid. With reference to FIG. 1 to FIG. 3, it includes a container body 600. The container body 600 is preferably a rectangular box with an accommodation space 610 formed therein. A wiring unit 300, a power transformation unit 400 and an inverter unit 500 are provided in the accommodation space 610. The variable-frequency drive skid also includes a first cooling unit 100 and a second cooling unit 200 which are also arranged in the accommodation space 610. The first cooling unit 100 includes an air duct 110 and a first cooling fan 140 arranged in the air duct 110. The power transformation unit 400 is located in the air duct 110. Airflow generated by the first cooling fan 140 passes through the air duct 110 to cool the power transformation unit 400. The second cooling unit 200 includes a cooling conductive assembly 210 and a second cooling fan 220, the cooling conductive assembly 210 abuts an inverter unit 500. The cooling conductive assembly 210 and the second cooling fan 220 are configured to cool the inverter unit 500. In this regard, the first cooling unit 100 removes excess heat from the power transformation unit 400 by means of air while the second cooling unit 200 removes excess heat from the inverter unit 500 by means of a combination of air and refrigerant, so as to make full use of internal space of the container and also to timely cool the power transformation unit 400 and the inverter unit 500 based on the integrated structure, thereby avoiding the voltage power transformation unit 400 and the inverter unit 500 from being unable to operate normally due to excessive high temperature, and therefore the operating efficiency and reliability of the whole machine is improved.

A separation plate (not labeled in the drawings) is provided in the accommodation space 610, which is used to divide it into a plurality of sub spaces mutually independent with each other. The wiring unit 300, the power transformation unit 400, the inverter unit 500, and the second cooling unit 200 are respectively arranged in one sub space, wherein the power transformation unit 400 and the first cooling unit 100 share a sub space. The container body 600 is provided with doors (not labeled in the drawings) corresponding to the sub spaces, units disposed therein could be checked and maintained by opening the door, which is convenient in usage. Additionally, the compartmentalized structural design of the accommodation space 610 also facilitates modular installation and improves assembly efficiency.

Figure 4:
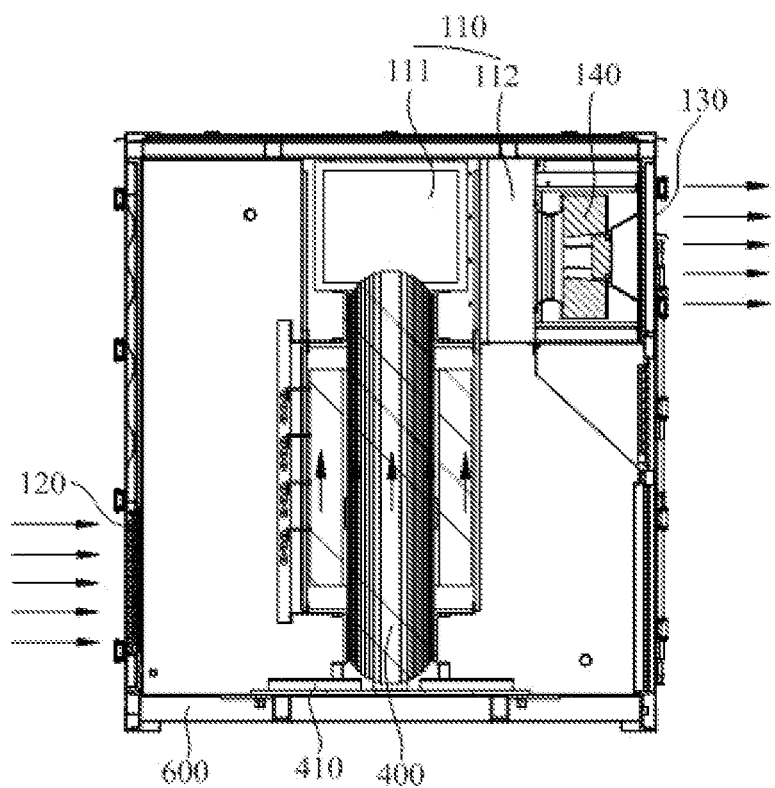
FIG. 4 is a cross-sectional view along a line A-A in FIG. 3.
Figure 5:
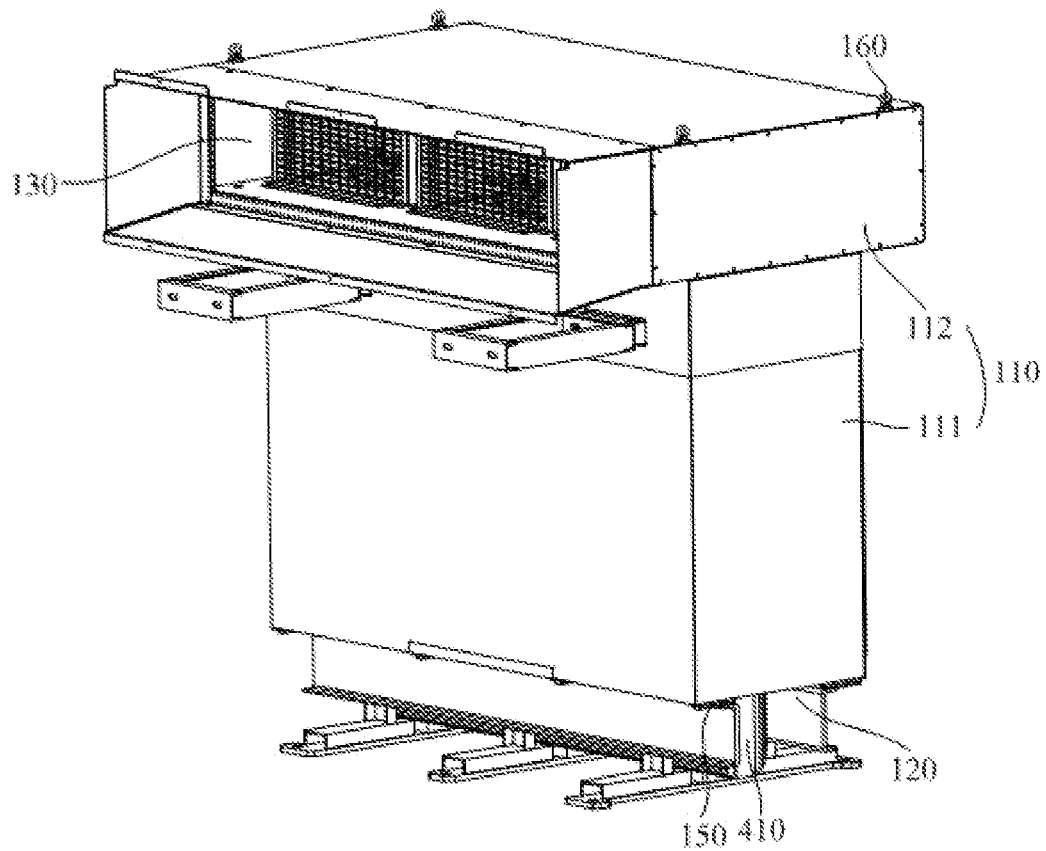
FIG. 5 is a schematic structural diagram of a first cooling unit of a container type variable-frequency drive skid according to the present invention.

With reference to FIG. 4 and FIG. 5, the air duct 110 includes a vertical air duct 111 and a horizontal air duct 112 that are communicated with each other, wherein the horizontal air duct 112 is located above the vertical air duct 111. The power transformation unit 400 is disposed within the vertical air duct 111 and the first cooling fan 140 is located in the horizontal air duct 112. The first cooling unit 100 further includes an air inlet 120 and an air outlet 130 which are communicated with the air duct 110, wherein the air inlet 120 is in communication with the vertical air duct 111 and the air outlet 130 is in communication with the horizontal air duct 112.

Ambient air enters the vertical air duct 111 from the air inlet 120 under a suction force exerted by the first cooling fan 140. During a process when air flows upwards into the horizontal air duct 112, the power transformation unit 400 is cooled by airflow while heated air after heat exchange with the power transformation unit 400 finally flows out through the horizontal air duct 112 and the air outlet 130.

Further, with reference to FIG. 1, FIG. 2 and FIG. 4, the air inlet 120 is disposed at a lower position on a rear side of the container body 600 while the air outlet 130 is located at an upper position on a front side of the container body 600. With those arrangements the air inlet 120 and the air outlet 130 are located on both sides of the power transformation unit 400; as air flowing from the air inlet 120 to the air outlet 130 it could circulate on both sides of the power transformation unit 400 for cooling, so that the temperature of the power transformation unit 400 is uniformly reduced and the cooling efficiency is improved.

Furthermore, the air inlet 120 and the air outlet 130 are provided with rain-proof shutters 620 to prevent external miscellaneous from entering the accommodation space 610 therethrough to affect internal components.

The power transformation unit 400 is fixedly mounted at a bottom of the container body 600 through a bracket 410. A lower end of the vertical air duct 111 and the bracket 410 are fixedly connected by connecting plates 150. Adjacent connecting plates 150 are spaced apart with a certain distance to avoid blocking air from entering the vertical air duct 111 from the air inlet 120. The upper end of the vertical air duct 111 is fixedly connected with the horizontal air duct 112, and an upper side of the horizontal air duct 112 is fixedly connected with the top of the container body 600, and in this way a fixed installation of the air duct 110 in the accommodation space 610 is realized.

During an installation process, the vertical air duct 111 is sleeved on the periphery of the power transformation unit 400 from top to bottom and the lower end of the vertical air duct 111 is fixedly connected with the bracket 410 through the connecting plates 150 to realize the fixation of the vertical air duct 111; the upper side of the horizontal air duct 112 is fixedly installed on the top of the container body 600 through lifting rings 160 to realize the fixation of the horizontal air duct 112; the positions where the vertical air duct 111 and the horizontal air duct 112 are connected are tightened by screws to realize the fixation of the overall air duct 110.

Figure 6:
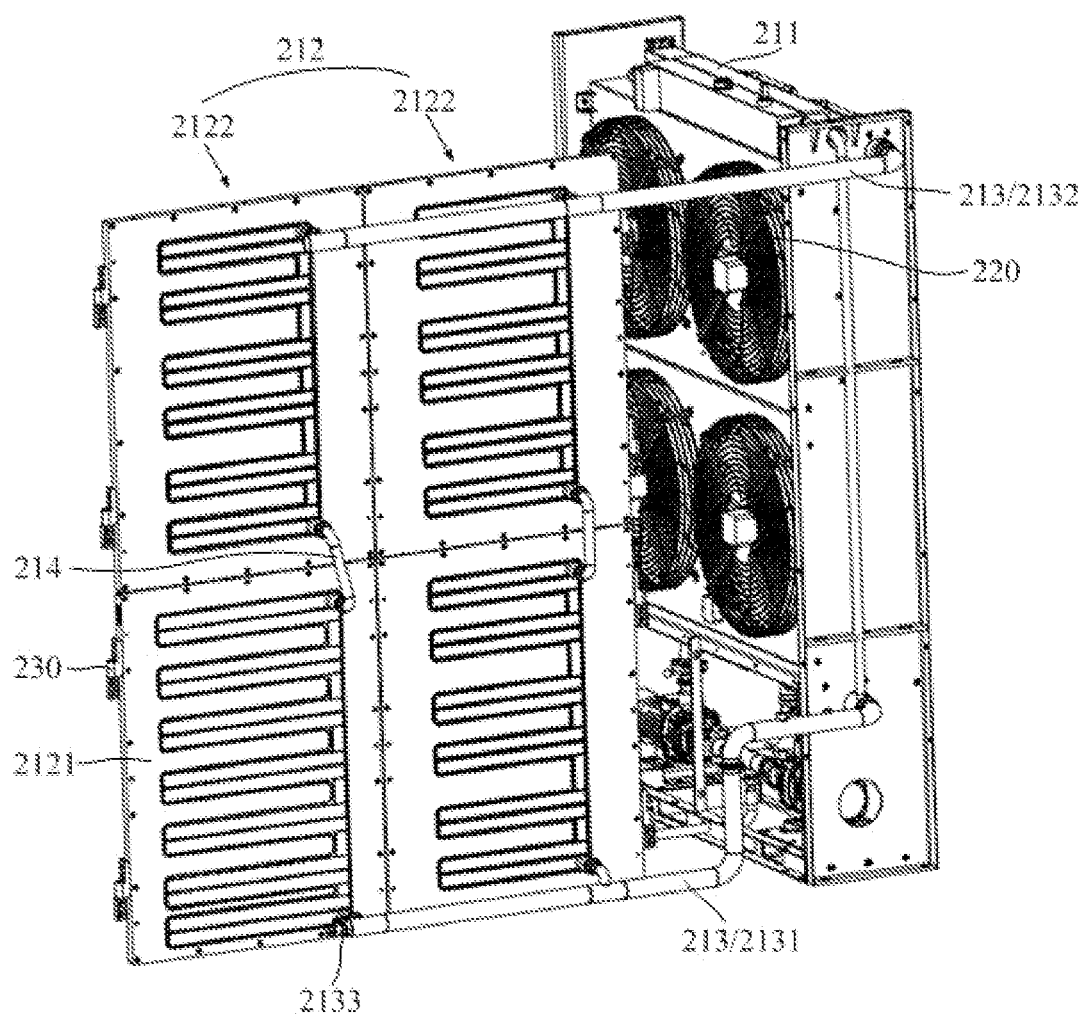
FIG. 6 is a schematic structural diagram of a second cooling unit of a container type variable-frequency drive skid according to the present invention.
Figure 7:
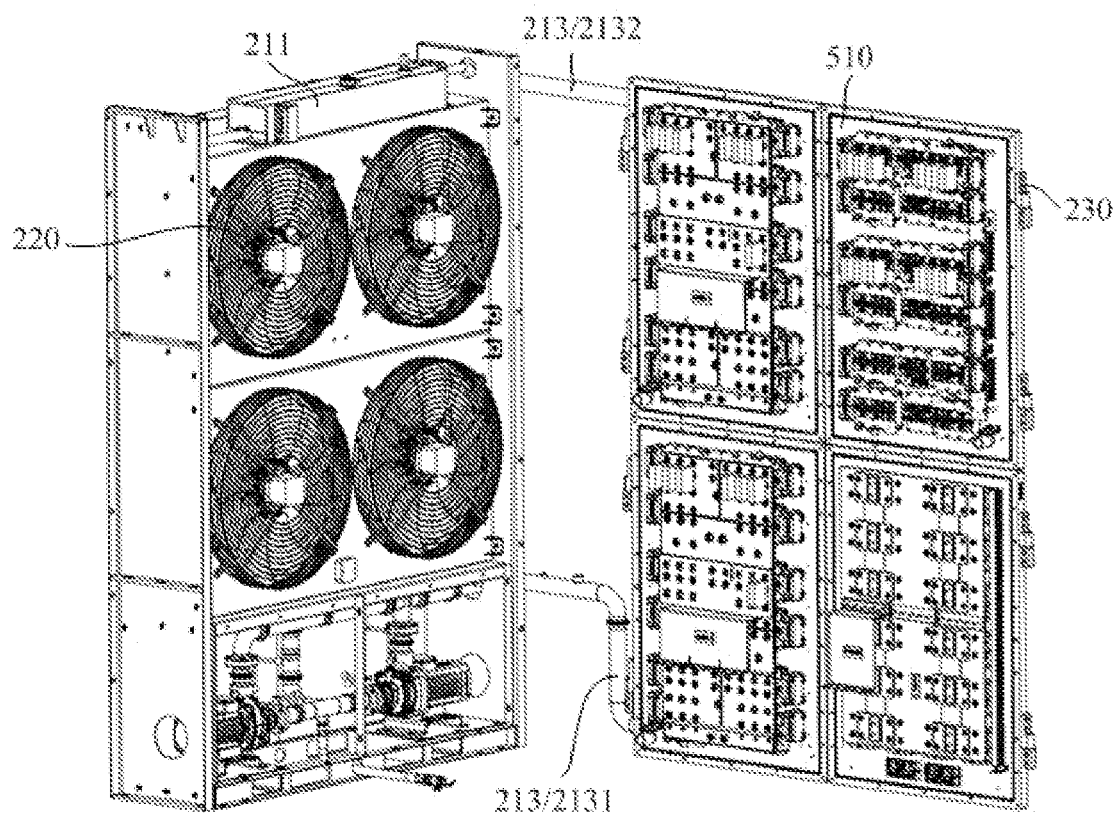
FIG. 7 is a schematic structural diagram of the second cooling unit shown in FIG. 6 from a perspective Q.

With reference to FIG. 6 and FIG. 7, the cooling conductive assembly 210 further includes a refrigerant containment box 211 and a cooling conductive plate assembly 212 which are in fluid communication with each other through a first pipe assembly 213; refrigerant is circulated within cooling conductive assembly 210 and the cooling conductive plate assembly 212 is located close to the inverter unit 500. Specifically, the first pipe assembly 213 further includes an inlet pipe 2131 and an outlet pipe 2132, wherein the in and out are relative to the cooling conductive plate assembly. In another word the refrigerant containment box 211 and the cooling conductive plate assembly 212 are in fluid communication with by means of the inlet pipe 2131 and the outlet pipe 2132 between them, thereby allowing refrigerant to circulate. Refrigerant in the refrigerant containment box 211 flows into the cooling conductive plate assembly 212 through the inlet pipe 2131. During a process when refrigerant flows to the cooling conductive plate assembly 212, refrigerant at a lower temperature absorbs and takes away heat generated by the inverter unit 500 for the cooling of the inverter unit 500; refrigerant after heat exchange flows back to the refrigerant containment box 211. In the refrigerant containment box 211, refrigerant at a higher temperature turns into refrigerant at a lower temperature and a new heat exchange cycle begins.

The refrigerant containment box 211 is arranged on the second cooling fan 220 to make full use of the space.

The refrigerant containment box 211 and the second cooling fan 220 are located at an end side of the accommodation space 610, and the cooling conductive plate assembly 212 is located at a rear area of the accommodation space 610. On one hand, the cooling conductive plate assembly 212 and the inverter unit 500 are close to each other to make cooling more efficiency; on the other hand, the second cooling fan 220 at the end side could further facilitate heat dissipation of the inverter unit 500 so that heat in the sub space where the inverter unit 500 is installed could be discharged by the second cooling fan 220 in time.

Further, with reference to FIG. 1, heat dissipation protective meshes 630 are provided at multiple positions of the container body 600 close to the second cooling fan 220, the refrigerant containment box 211 and the cooling conductive plate assembly 212 respectively, and that do not only play a protective role but also are beneficial to heat dissipation inside.

The cooling conductive plate assembly 212 includes a plurality of cooling conductive plate sub units 2122 arranged side by side, and further each cooling conductive plate sub unit 2122 includes a plurality of cooling conductive plates 2121 arranged side by side, and two adjacent cooling conductive plates 2121 within one cooling conductive plate sub unit 2122 are in communication with each other by a second pipe 214. In the present embodiment, determined by the size of the inverter unit 500, two cooling conductive plate sub units 2122 are provided. The two cooling conductive plate sub units 2122 are arranged side by side along a horizontal direction. Each cooling conductive plate sub unit 2122 includes two cooling conductive plates 2122 arranged side by side along a vertical direction, and the two cooling conductive plates 2121 are in communication with each other through the second pipe 214.

Refrigerant from the inlet pipe 2131 enters each cooling plate sub unit 2122 respectively, converges in the outlet pipe 2132, and finally flows back to the refrigerant containment box 211.

With reference to FIG. 6 and FIG. 7, the cooling conductive plates 2121 are detachably connected to the inverter unit 500. The inverter unit 500 includes a mounting plate 510 configured to install electrical components. Each cooling conductive plate 2121 is connected to the mounting plate 510 through a hinge 230, so that the cooling conductive plate 2121 could be opened like a door for maintenance, thereby making the maintenance and operation more convenient. The second pipe 214 does not only play a role to connect two adjacent cold conductive plates 2121, but also serves as a handle to open the two cooling conductive plates 2121 which are disposed from top to bottom simultaneously.

The first pipe 213 is provided with a discharge port 2133. In the present embodiment, the discharge port 2133 is formed on the inlet pipe 2131. Refrigerant could be discharged from the discharge port 2133 to facilitate maintenance operations.

Finally, it should be noted that the above embodiments are only used to illustrate the technical solutions of the present invention, not to limit them; although the present invention has been described in detail with reference to the foregoing embodiments, those of ordinary skill in the art should understand that: technical solutions recited in the foregoing embodiments could be modified, or some of the technical features thereof could be equivalently replaced; but these modifications or replacements do not cause the essence of the corresponding technical solutions to deviate from the spirit and scope of the technical solutions of the embodiments of the present invention.

The invention claimed is:

1. A container type variable-frequency drive skid comprising a container body with an accommodation space formed therein, the accommodation space is provided with a wiring unit, a power transformation unit and an inverter unit therein, wherein the skid further comprises:
   a first cooling unit arranged in the accommodation space, which comprises:
      an air duct in which the power transformation unit is disposed; and
      a first cooling fan arranged in the air duct, which is configured to drive air pass the air duct for cooling of the power transformation unit;
   and
   a second cooling unit arranged in the accommodation space including a cooling conductive assembly disposed close to the inverter unit and a second cooling fan which are configured to cool down the inverter unit;
   wherein the cooling conductive assembly comprises a refrigerant containment box and a cooling conductive plate assembly, the refrigerant containment box is in fluid communication with the cooling conductive plate assembly through a first pipe, a refrigerant circulates in the cooling conductive assembly, the cooling conductive plate assembly is disposed close to the inverter unit, and the refrigerant containment box is arranged on the second cooling fan.

2. The container type variable-frequency drive skid according to claim 1, wherein the air duct comprises:
   a vertical air duct, within which the power transformation unit is disposed;
   a horizontal air duct disposed above the vertical air duct and communicated with the vertical air duct, within which the first cooling fan is arranged;
   the first cooling unit further comprises:
      an air inlet and an air outlet which are communicated with the air duct; wherein the air inlet is in communication with the vertical air duct and the air outlet is in communication with the horizontal air duct.

3. The container type variable-frequency drive skid according to claim 2, wherein the air inlet is disposed at a lower position on a rear side of the container body and the air outlet is disposed at an upper position on a front side of the container body.

4. The container type variable-frequency drive skid according to claim 2, wherein the air inlet and the air outlet are provided with rain-proof shutters.

5. The container type variable-frequency drive skid according to claim 1, wherein a discharge port is formed on the first pipe.

6. The container type variable-frequency drive skid according to claim 1, wherein the cooling conductive plate assembly comprises a plurality of cooling conductive plate sub units arranged side by side, each cooling conductive plate sub unit includes a plurality of cooling conductive plates arranged side by side and two adjacent cooling conductive plates within one cooling conductive plate sub unit are in communication with each other through a second pipe.

7. The container type variable-frequency drive skid according to claim 6, wherein the cooling conductive plates are detachably connected to the inverter unit.

8. The container type variable-frequency drive skid according to claim 1, wherein the refrigerant containment box and the second cooling fan are located at an end side of the accommodation space and the cooling conductive plate assembly is located at a rear area of the accommodation space.

9. The container type variable-frequency drive skid according to claim 8, wherein the container body is close to the second cooling fan and heat dissipation protective meshes are provided at positions of the container body close to the second cooling fan, the refrigerant containment box and the cooling conductive plate assembly, respectively.

* * * * *